(12) United States Patent
Maruyama

(10) Patent No.: US 6,232,807 B1
(45) Date of Patent: May 15, 2001

(54) PULSE GENERATING CIRCUIT

(75) Inventor: Shigeru Maruyama, Kanagawa (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/478,700

(22) Filed: Jan. 6, 2000

(30) Foreign Application Priority Data

Jan. 7, 1999 (JP) .................................................. 11-002130

(51) Int. Cl.[7] ............................ H03K 3/017; H03K 5/04; H03K 7/08

(52) U.S. Cl. .......................... 327/172; 327/175; 327/291; 327/299

(58) Field of Search ..................................... 327/171, 172, 327/174, 175, 176, 291, 294

(56) References Cited

U.S. PATENT DOCUMENTS 5,982,703 * 11/1999 Oh ...................................... 365/230.06
6,031,388 * 2/2000 Dobbelaere ............................. 326/17
6,084,454 * 7/2000 Holst ..................................... 327/198

* cited by examiner

Primary Examiner—Terry D. Cunningham
Assistant Examiner—Quan Tra
(74) Attorney, Agent, or Firm—Hayes, Soloway, Hennesse Grossman & Hage, P.C.

(57) ABSTRACT

There is disclosed a pulse generating circuit which comprises an oscillator circuit 1 receiving an input clock signal, a P-channel MOS transistor 2 having a gate connected to an output of the oscillator circuit 1, a delay circuit 4 having an input connected to an output line 10, an oscillator circuit 5 having an input connected to an output of the delay circuit 4, an N-channel MOS transistor 3 having a gate connected to an output of the oscillator circuit 5, an inverter 6 having an input connected to the output of the oscillator circuit 1, a delay circuit 7 having an input connected to the output line 10, an AND circuit 8 receiving an output of the inverter 6 and an output of the delay circuit 7, and an N-channel MOS transistor 9 having a gate connected to an output of the AND circuit. In the case that the output line 10 is at a high level in an initial condition, if the input clock signal changes from a low level to a high level, the output of the delay circuit 7 having the input connected to the output line 10 becomes the high level, and the output of the inverter 6 becomes the high level, so that the AND circuit 8 turns on the N-channel MOS transistor 9, with the result that the output line 10 is brought to the low level. Accordingly, if the input clock signal changes from the low level to the high level in a next cycle, the pulse generating circuit brings the output line to the high level, so that a normal pulse generating operation starts.

10 Claims, 6 Drawing Sheets

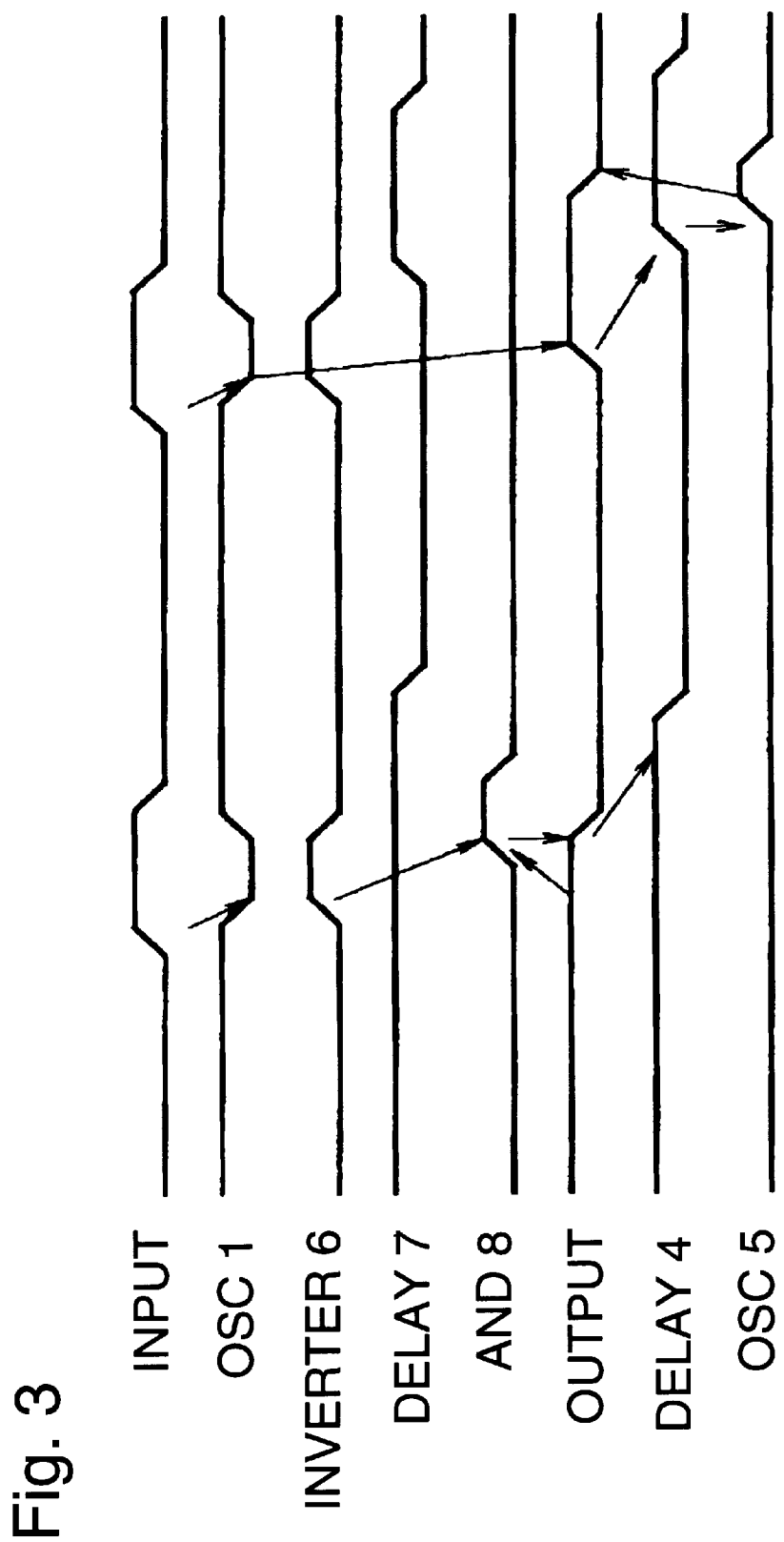

PULSE GENERATING CIRCUIT

BACKGROUND OF THE INVENTION

The present invention relates to a pulse generating circuit, and more specifically to a pulse generating circuit capable of generating an internal clock pulse having a constant pulse width independent of the duty of an external input clock signal.

In a semiconductor device operating in synchronism with an input clock signal supplied from an external control system, it is assumed that a time required for an internal operation in the semiconductor device is for example 1.5 ns and a time required for a resetting operation is for example 1.5 ns, and further, an active operation is executed at a high level "H" of a clock signal and the resetting operation is executed at a low level "L" of the clock signal and a cycle of the clock signal is 4 ns. In this case, if the width of the high level "H" of an internal clock is set at about 2 ns, both the active operation and the resetting operation can be executed with a margin of about 0.5 ns.

However, if the width of the high level "H" of the internal clock varies dependently upon the duty of an external clock signal, the active operation cannot be executed with the high level width of 1 ns, nor can the resetting operation be executed with 1 ns.

In order to avoid the above mentioned inconvenience, a pulse generating circuit capable of generating an internal clock signal independently upon the duty of the external clock signal, has been proposed as shown in FIG. 6.

The pulse generating circuit shown in FIG. 6 includes an oscillator circuit 21 responding to a low-to-high transition of an input clock signal to generate a downward pulse, a P-channel MOS transistor 22 having a source connected to a high voltage supply, a gate connected to an output of the oscillator circuit 21, and a drain connected to an output line 28, an N-channel MOS transistor 23 having a drain connected to the output line 28, a gate connected to an output of another oscillator circuit 25 and a source connected to ground, a delay circuit 24 having an input connected to the output line 28 and an output connected to an input of the oscillator circuit 25, the oscillator circuit 25 having the input connected to the output of the delay circuit 24 and the output connected to the gate of the N-channel MOS transistor 23, and another N-channel MOS transistor 26 having a drain connected to the output line 28, a gate connected to a power-on circuit 27 and a source connected to the ground.

Now, an operation of the prior art pulse generating circuit shown in FIG. 6 will be described. When the output of the prior art pulse generating circuit shown in FIG. 6 is at a low level "L" in an initial condition, the oscillator circuit 21 generates the downward pulse in response to the low-to-high transition of the input clock signal. If the oscillator circuit 21 generates the downward pulse, the P-channel MOS transistor 22 is turned on so that the output line 28 of the pulse generating circuit is brought to a high level "H".

In response to the low-to-high transition of the output line 28, the oscillator circuit 25 generates an upward pulse after a delay of the delay circuit 24, and the upward pulse is applied to the gate of the N-channel MOS transistor 23. As a result, the N-channel MOS transistor 23 is turned on so that the output line 28 of the pulse generating circuit is brought to a low level "L".

Thus, in the pulse generating circuit shown in FIG. 6, even if the pulse width of the external input clock signal is shorter than a required pulse width of the internal pulse, the internally generated pulse can have a constant pulse width, which is determined by the delay amount of the delay circuit 24.

In the pulse generating circuit shown in FIG. 6, however, if the output of the pulse generating circuit is the high level "H" in the initial condition, the output of the delay circuit 24 which should delay the low-to-high transition of the output of the pulse generating circuit, remains fixed at the high level "H" as shown in FIG. 7. Therefore, the output of the oscillator circuit 25 which should generate the upward pulse in response to the low-to-high transition in the output of the delay circuit 24, also remains fixed at the low level "L". As a result, the output of the pulse generating circuit remains fixed at the high level "H", regardless of the input clock signal.

In order to the prevent the just above mentioned inconvenience, the pulse generating circuit shown in FIG. 6 includes the power-on circuit 27, which operates to forcibly bring the output to the low level "L" at a power-on time. As shown in FIG. 8, when a power supply voltage Vcc is rising as the result of the power-on, if the power supply voltage Vcc exceeds a predetermined level, the power-on circuit 27 turns on the N-channel MOS transistor 26 to forcibly brings the output to the low level "L". However, since the power-on circuit does not operate in a situation other than the power-on time, the above mentioned inconvenience cannot be completely overcome.

BRIEF SUMMARY OF THE INVENTION

Accordingly, it is an object of the present invention to provide a pulse generating circuit which has overcome the above mentioned problem of the prior art.

Another object of the present invention is to provide a pulse generating circuit capable of realizing a normal pulse generating operation even if the output level is at the high level in the initial condition.

The above and other objects of the present invention are achieved in accordance with the present invention by a pulse generating circuit comprising a first pulse generating means receiving an input clock signal for generating a first pulse in synchronism with the clock signal, a first P-channel MOS transistor having a source connected to a high voltage supply, a gate connected to an output of the first pulse generating means and a drain connected to an output line, a first delay means having a first predetermined delay time and having an input connected to the output line, a second pulse generating means having an input connected to an output of the first delay means, for generating a second pulse in synchronism with a level transition of the output of the first delay means, a first N-channel MOS transistor having a drain connected to the output line, a gate connected to an output of the second pulse generating means and a source connected to ground, and a detecting means connected to the output of the first pulse generating means and also connected to the output line, for bringing the output line to a low level when the input clock signal changes from a low level to a high level in the condition that the output line is at a high level.

In one embodiment of the above mentioned clock generating circuit, the detecting means includes a second delay means having a second predetermined delay time and having an input connected to the output line, an inverter means having an input connected to the output of the first pulse generating means, an AND circuit receiving an output of the inverter means and an output of the second delay means, and a second N-channel MOS transistor having a drain connected to the output line, a gate connected to an output of the AND circuit and a source connected to the ground.

Preferably, the second predetermined delay time of the second delay means is longer than a pulse width of the first pulse generated by the first pulse generating means. In addition, the first pulse generating means generates a downward pulse, and the second pulse generating means generates an upward pulse.

According to another aspect of the present invention, there is provided a pulse generating circuit comprising a first pulse generating means receiving an input clock signal for generating a first pulse in synchronism with the clock signal, a first N-channel MOS transistor having a drain connected to an output line, a gate connected to an output of the first pulse generating means and a source connected to ground, a first delay means having a first predetermined delay time and having an input connected to the output line, a second pulse generating means having an input connected to an output of the first delay means, for generating a second pulse in synchronism with a level transition of the output of the first delay means, a first P-channel MOS transistor having a source connected to a high voltage supply, a gate connected to an output of the second pulse generating means and a drain connected to the output line, and a detecting means connected to the output of the first pulse generating means and also connected to the output line, for bringing the output line to a high level when the input clock signal changes from a low level to a high level in the condition that the output line is at a low level.

In one embodiment of the above mentioned clock generating circuit, the detecting means includes a second delay means having a second predetermined delay time and having an input connected to the output line, an inverter means having an input connected to the output of the first pulse generating means, an OR circuit receiving an output of the inverter means and an output of the second delay means, and a second P-channel MOS transistor having a source connected to the high voltage supply, a gate connected to an output of the OR circuit and a drain connected to the output line.

Preferably, the second predetermined delay time of the second delay means is longer than a pulse width of the first pulse generated by the first pulse generating means. In addition, the first pulse generating means generates an upward pulse, and the second pulse generating means generates a downward pulse.

The above and other objects, features and advantages of the present invention will be apparent from the following description of preferred embodiments of the invention with reference to the accompanying drawings.

BRIEF DESCRIPTION OF THE DRAWINGS

FIG. 3 is a waveform diagram illustrating an operation of the first embodiment of the pulse generating circuit in accordance with the present invention when the output is at a high level in the initial condition;

DETAILED DESCRIPTION OF THE INVENTION

Figure 1:
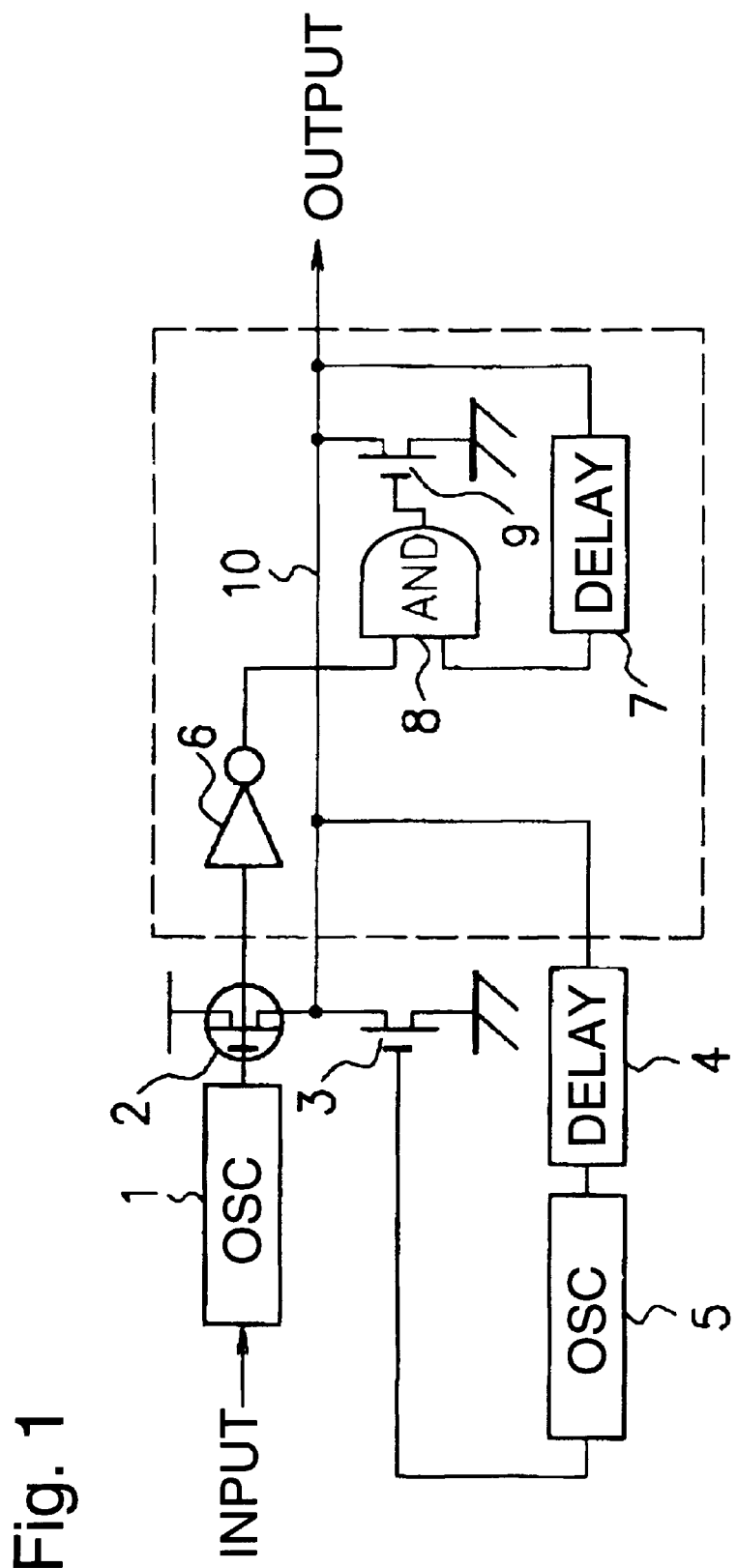
FIG. 1 is a,circuit diagram of a first embodiment of the pulse generating circuit in accordance with the present invention.

Referring to FIG. 1, there is shown a circuit diagram of a first embodiment of the pulse generating circuit in accordance with the present invention.

The first embodiment of the pulse generating circuit shown in FIG. 1 comprises an oscillator circuit 1 receiving an external input clock signal for generating a downward pulse in synchronism with the external input clock signal, a P-channel MOS transistor 2 having a source connected to a high voltage supply, a gate connected to an output of the oscillator circuit 1 and a drain connected to an output line 10, an N-channel MOS transistor 3 having a drain connected to the output line 10, a gate connected to an output of an oscillator circuit 5 and a source connected to ground, a delay circuit 4 having a first predetermined delay time and having an input connected to the output line 10, the oscillator circuit 5 having an input connected to an output of the delay circuit 4 and the output connected to the gate of the N-channel MOS transistor 3, an inverter 6 having an input connected to the output of the oscillator circuit 1, a delay circuit 7 having a second predetermined delay time and having an input connected to the output line 10, an AND circuit 8 receiving an output of the inverter 6 and an output of the delay circuit 7, and an N-channel MOS transistor 9 having a drain connected to the output line 10, a gate connected to an output of the AND circuit 8 and a source connected to the ground.

The oscillator circuit 1 generates the downward pulse in response to a low-to-high transition of the external input clock signal. The P-channel MOS transistor 2 is turned on in response to the downward pulse supplied from the oscillator circuit 1, so that the output line 10 is brought to a high level "H".

The first predetermined delay time of the delay circuit 4 determines a pulse width of a pulse outputted from the output line 10 of the shown pulse generating circuit. The oscillator circuit 5 generates an upward pulse in response to a low-to-high transition of the output of the delay circuit 4 having the input connected to the output line 10. In response to the upward pulse outputted from the oscillator circuit 5, the N-channel MOS transistor 3 is turned on so that the output line 10 is brought to a low level "L".

The inverter 6 generates a pulse having a phase opposite to that of the output of the oscillator circuit 1. The second predetermined delay time of the delay circuit 7 is longer than a pulse width of the pulse generated by the oscillator circuit 1. The AND circuit 8 outputs a high level "H" to the gate of the N-channel MOS transistor 9 when the high level "H" is outputted from the delay circuit 7 as the result of the high level of the output line 10 and the high level "H" is outputted from the inverter 6. In response to the high level "H" applied from the AND circuit 8 to the gate of the N-channel MOS transistor 9, the N-channel MOS transistor 9 is turned on to bring the output line 10 to the low level "L".

Next, an operation of the shown pulse generating circuit will be described.

Figure 2:
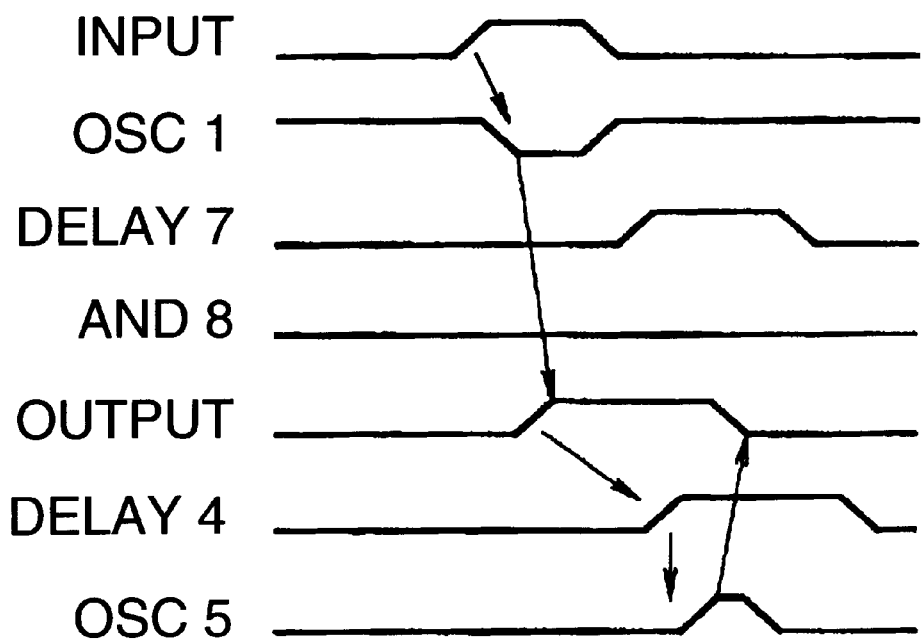
FIG. 2 is a waveform diagram illustrating an operation of the first embodiment of the pulse generating circuit in accordance with the present invention when the output is at a low level in an initial condition.

First, an operation of the shown pulse generating circuit when the output is at a low level in an initial condition, will be explained with reference to FIG. 2, which is a waveform diagram illustrating an operation of the first embodiment of the pulse generating circuit in accordance with the present invention when the output is at the low level in the initial condition.

If the input clock signal becomes a high level "H", the oscillator circuit 1 generates the downward pulse, which is applied to the gate of the P-channel MOS transistor 2, so that the P-channel MOS transistor 2 is turned on during a low level period of the downward pulse. As a result, the output line 10 is brought to the high level "H".

If the output line 10 is brought to the high level "H", the oscillator circuit 5 generates the upward pulse after the delay time of the delay circuit 4 having the input connected to the output line 10. This upward pulse is applied to the gate of the N-channel MOS transistor 3, so that the N-channel MOS transistor 3 is turned on. As a result, the output line 10 is brought to the low level "L".

Thus, if the output is at the low level in the initial condition, the shown pulse generating circuit immediately starts a normal pulse generating operation of generating an upward pulse having the constant pulse width corresponding to the delay time of the delay circuit 4.

Next, an operation of the shown pulse generating circuit when the output is at a high level in an initial condition, will be explained with reference to FIG. 3, which is a waveform diagram illustrating an operation of the first embodiment of the pulse generating circuit in accordance with the present invention when the output is at the high level in the initial condition.

If the input clock signal becomes a high level "H", the oscillator circuit 1 generates the downward pulse, which is applied to the gate of the P-channel MOS transistor 2, so that the P-channel MOS transistor 2 is turned on during a low level period of the downward pulse. However, since the output line 10 is at the high level "H" in the initial condition, the output line 10 remains at the high level "H".

Therefore, the delay circuit 4 and the oscillator circuit 5 which operate in response to the low-to-high transition of the output line 10, do not operate, with the result that the output of the oscillator circuit 5 is fixed at the low level "L". Accordingly, the output line 10 is fixed at the high level "H".

At this time, however, since the output of the delay circuit 7 having the input connected to the output line 10 is at the high level "H", and since the inverter 6 receiving the downward pulse from the oscillator circuit 1 generates an upward pulse, the AND circuit 8 generates an upward pulse, which is applied to the gate of the N-channel MOS transistor 9, so that the N-channel MOS transistor 9 is turned on. As a result, the output line 10 is brought to the low level "L". Accordingly, if the input clock signal changes from the low level to the high level in a next cycle, the shown pulse generating circuit brings the output line 10 to the high level "H". Accordingly, an upward pulse having the constant pulse width corresponding to the delay time of the delay circuit 4 is generated on the output line 10, as shown in a night half of FIG. 3.

Thus, even if the output is at the high level in the initial condition, the shown pulse generating circuit starts the normal pulse generating operation after a dummy operation of one cycle. Therefore, a dedicated circuit such as the power-on circuit for stabilizing the pulse generation, is no longer necessary. Therefore, a circuit surrounded by a dotted line in FIG. 1 constitutes a detecting means for bringing the output line to a low level when the input clock signal changes from a low level to a high level in the condition that the output line is at a high level.

In the above mentioned embodiment, the delay time of the delay circuit 7 is required to be set longer than the pulse width of the pulse generated by the oscillator circuit 1. If the delay time of the delay circuit 7 is shorter than the pulse width of the pulse generated by the oscillator circuit 1, there occurs an inconvenience as shown in FIG. 4, which is a waveform diagram for illustrating the operation of the first embodiment of the pulse generating circuit when the delay time of the delay circuit 7 is shorter than the pulse width of the pulse generated by the oscillator circuit 1.

Figure 4:
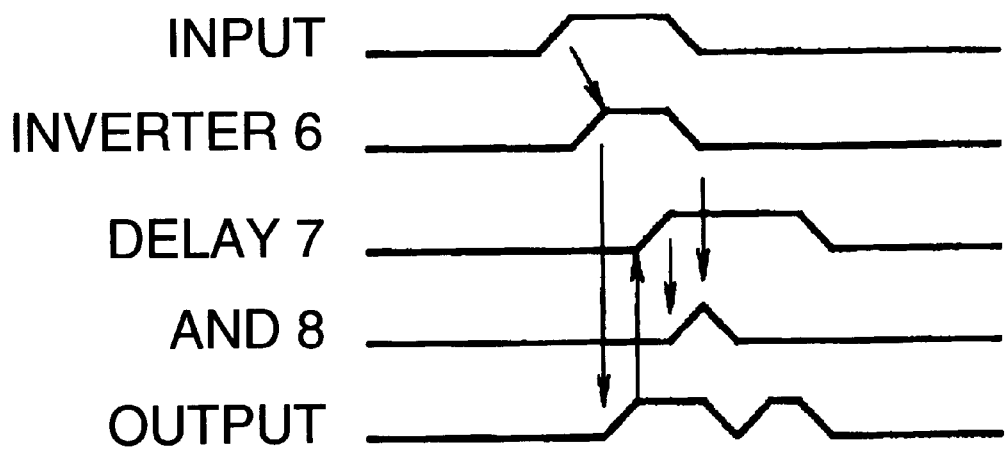
FIG. 4 is a waveform diagram for illustrating a necessary delay time of the second delay circuit in the first embodiment of the pulse generating circuit in accordance with the present invention.

As shown in FIG. 4, if the delay time of the delay circuit 7 is shorter than the pulse width of the pulse generated by the oscillator circuit 1, the output of the delay circuit 7 becomes the high level "H" before the output of the inverter 6 receiving the output of the oscillator circuit 1 becomes the low level "L", with the result that the output of the AND circuit 8 becomes the high level "H" once. Therefore, the output line 10 is erroneously pulled down, which is an error in the operation of the pulse generating circuit.

Next, a second embodiment of the pulse generating circuit in accordance with the present invention will be described with reference to FIG. 5, which is a circuit diagram of the second embodiment of the pulse generating circuit.

Figure 5:
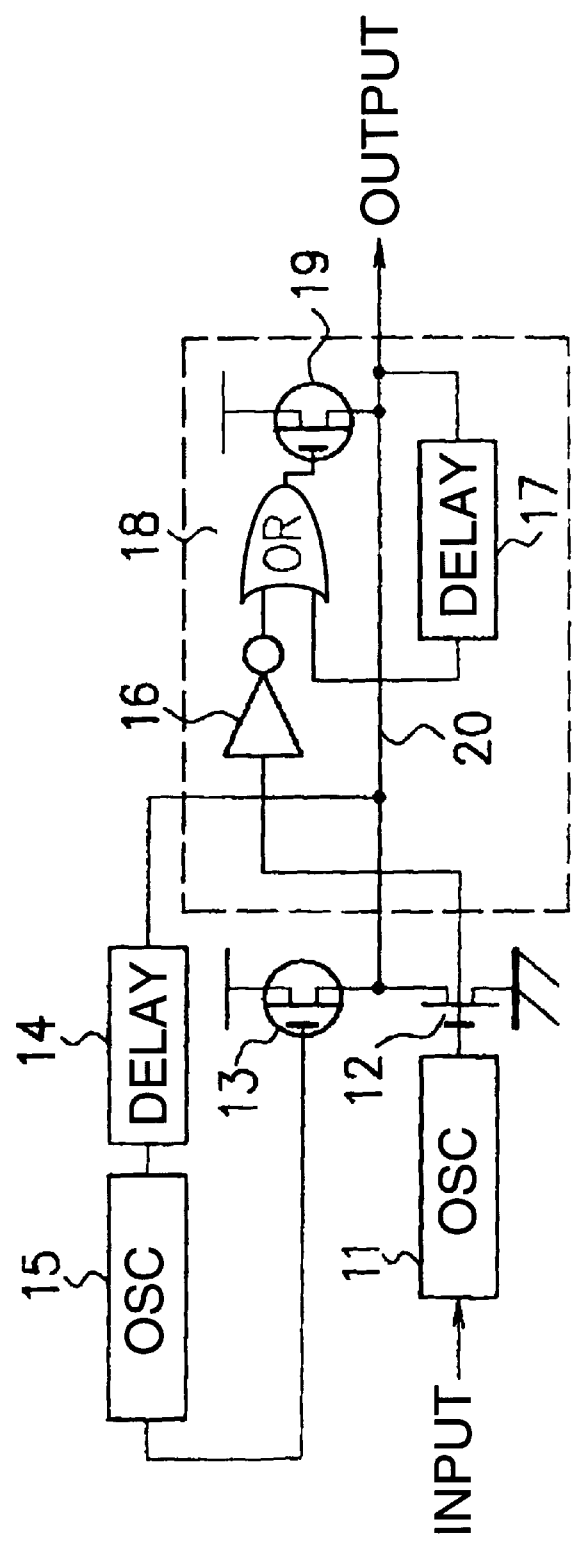
FIG. 5 is a circuit diagram of a second embodiment of the pulse generating circuit in accordance with the present invention.
Figure 6:
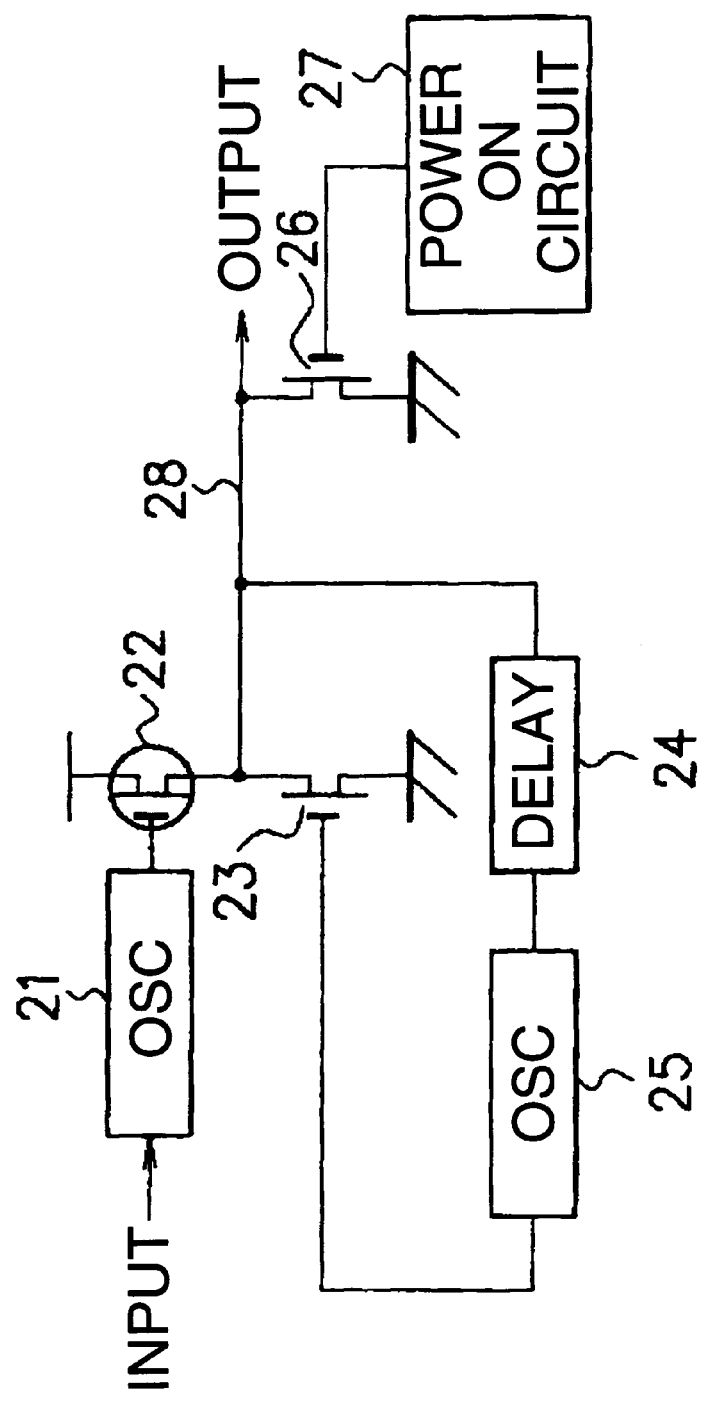
FIG. 6 is a circuit diagram of the prior art pulse generating circuit.
Figure 7:
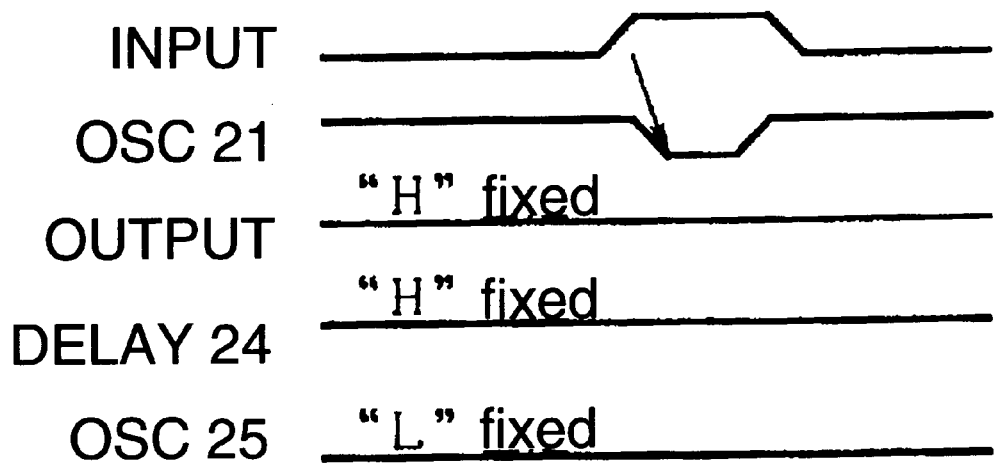
FIG. 7 is a waveform diagram illustrating an operation of the prior art pulse generating circuit shown in FIG. 6 when the output is at a high level in an initial condition.
Figure 8:
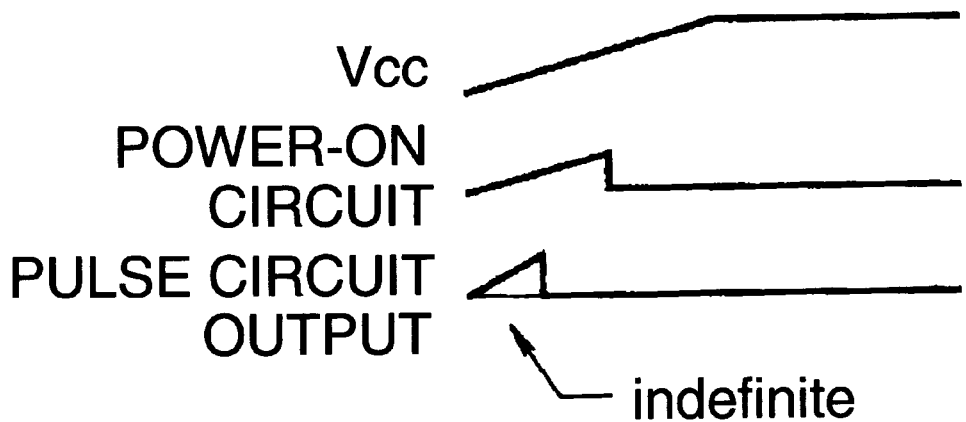
FIG. 8 is a waveform diagram for illustrating an operation of the power-on circuit included in the prior art pulse generating circuit shown in FIG. 6.

The second embodiment of the pulse generating circuit shown in FIG. 5, comprises an oscillator circuit 11 receiving an external input clock signal for generating an upward pulse in synchronism with the external input clock signal, an N-channel MOS transistor 12 having a drain connected to an output line 20, a gate connected to an output of the oscillator circuit 11 and a source connected to ground, a P-channel MOS transistor 13 having a source connected to a high voltage supply, a gate connected to an output of an oscillator circuit 15 and a drain connected to the output line 20, a delay circuit 14 having a first predetermined delay time and having an input connected to the output line 20, the oscillator circuit 15 having an input connected to an output of the delay circuit 14 and the output connected to the gate of the P-channel MOS transistor 13, an inverter 16 having an input connected to the output of the oscillator circuit 11, a delay circuit 17 having a second predetermined delay time and having an input connected to the output line 20, an OR circuit 18 receiving an output of the inverter 16 and an output of the delay circuit 17, and a P-channel MOS transistor 19 having a source connected to the high voltage supply, a gate connected to an output of the OR circuit 18 and a drain connected to the output line 20.

The oscillator circuit 11 generates the upward pulse in response to a low-to-high transition of the external input clock signal. The N-channel MOS transistor 12 is turned on in response to the upward pulse supplied from the oscillator circuit 11, so that the output line 20 is brought to a low level "L".

The first predetermined delay time of the delay circuit 14 determines a pulse width of a pulse outputted from the output line 20 of the shown pulse generating circuit. The oscillator circuit 15 generates a downward pulse in response to a high-to-low transition of the output of the delay circuit 14 having the input connected to the output line 20. In response to the downward pulse outputted from the oscillator circuit 15, the P-channel MOS transistor 13 is turned on so that the output line 20 is brought to a high level "H".

The inverter 16 generates a pulse having a phase opposite to that of the output of the oscillator circuit 11. The second predetermined delay time of the delay circuit 17 is longer than a pulse width of the pulse generated by the oscillator circuit 11. The OR circuit 18 outputs a low level "L" to the gate of the P-channel MOS transistor 19 when the low level "L" is outputted from the delay circuit 17 as the result of the low level of the output line 20 and the low level "L" is outputted from the inverter 16. In response to the low level "L" applied from the OR circuit 18 to the gate of the P-channel MOS transistor 19, the P-channel MOS transistor 19 is turned on to bring the output line 20 to the high level "H".

The above mentioned second embodiment of the pulse generating circuit is characterized in that, in the case that the output is at the low level "L" in an initial condition, when the input clock signal is brought from the low level "L" to the high level "H", the output line 20 is brought to the high level.

Now, an operation of the second embodiment configured to achieve this advantage will be described.

In the case that the output is at the low level in the initial condition, if the input clock signal becomes a high level "H", the oscillator circuit 11 generates the upward pulse, which is applied to the gate of the N-channel MOS transistor 12, so that the N-channel MOS transistor 12 is turned on during a high level period of the upward pulse. However, since the output line 20 is at the low level "L" in the initial condition, the output line 20 remains at the low level "L".

Therefore, the delay circuit 14 and the oscillator circuit 15 which operate in response to the high-to-low transition of the output line 20, do not operate, with the result that the output of the oscillator circuit 15 is fixed at the high level "H". Accordingly, the output line 20 is fixed at the low level "L".

At this time, however, since the output of the delay circuit 17 having the input connected to the output line 20 is at the low level "L", and since the inverter 16 receiving the upward pulse from the oscillator circuit 11 generates a downward pulse, the OR circuit 18 generates a downward pulse, which is applied to the gate of the P-channel MOS transistor 19, so that the P-channel MOS transistor 19 is turned on. As a result, the output line 20 is brought to the high level "H". Accordingly, if the input clock signal changes from the low level to the high level in a next cycle, the shown pulse generating circuit brings the output line 20 to the low level "L". Accordingly, a downward pulse having the constant pulse width corresponding to the delay time of the delay circuit 14 is generated on the output line 20.

Thus, even if the output is at the low level in the initial condition, the shown pulse generating circuit starts a normal pulse generating operation after a dummy operation of one cycle. Therefore, a dedicated circuit such as the power-on circuit for stabilizing the pulse generation, is no longer necessary. Therefore, a circuit surrounded by a dotted line in FIG. 5 constitutes a detecting means for bringing the output line to a high level when the input clock signal changes from a low level to a high level in the condition that the output line is at a low level.

In the above mentioned second embodiment, the delay time of the delay circuit 17 is required to be set longer than the pulse width of the pulse generated by the oscillator circuit 11, similarly to the first embodiment.

Incidentally, when the output is at the high level "H" in the initial condition, the second embodiment of the pulse generating circuit immediately starts the normal pulse generating operation of generating a downward pulse having the constant pulse width corresponding to the delay time of the delay circuit 14. Namely, in the case that the output is at the high level "H" in the initial condition, if the input clock signal becomes the high level "H", the oscillator circuit 11 generates the upward pulse, which is applied to the gate of the N-channel MOS transistor 12, so that the N-channel MOS transistor 12 is turned on during a high level period of the upward pulse. As a result, the output line 20 is brought to the low level "L".

If the output line 20 is brought to the low level "L", the oscillator circuit 15 generates the downward pulse after the delay time of the delay circuit 14 having the input connected to the output line 20. This downward pulse is applied to the gate of the P-channel MOS transistor 13, so that the P-channel MOS transistor 13 is turned on. As a result, the output line 20 is brought to the high level "H".

As mentioned above, the pulse generating circuit in accordance with a first aspect of the present invention includes a second delay means having the second predetermined delay time and having an input connected to the output line, an inverter means having an input connected to the output of the first pulse generating means, an AND circuit receiving an output of the inverter means and an output of the second delay means, and a second N-channel MOS transistor having a drain connected to the output line, a gate connected to an output of the AND circuit and a source connected to the ground.

Thus, in the case that the output is at the high level in the initial condition, when the input clock signal changes from the low level to the high level, since the output of the second delay means having the input connected to the output line is at the high level, and since the output of the inverter means becomes the high level, the AND circuit turns on the second N-channel MOS transistor, with the result that the output line is brought to the low level. Accordingly, if the input clock signal changes from the low level to the high level in a next cycle, the pulse generating circuit brings the output line to the high level, so that the normal pulse generating operation starts.

Therefore, even if the output is at the high level in the initial condition, the pulse generating circuit starts the normal pulse generating operation after a dummy operation of one cycle. Accordingly, a dedicated circuit such as the power-on circuit for stabilizing the pulse generation, is no longer necessary.

Furthermore, the pulse generating circuit in accordance with a second aspect of the present invention includes a second delay means having a second predetermined delay time and having an input connected to the output line, an inverter means having an input connected to the output of the first pulse generating means, an OR circuit receiving an output of the inverter means and an output of the second delay means, and a second P-channel MOS transistor having a source connected to the high voltage supply, a gate connected to an output of the OR circuit and a drain connected to the output line.

Thus, in the case that the output is at the low level in the initial condition, when the input clock signal changes from the low level to the high level, since the output of the second delay means having an input connected to the output line is at the low level, and since the output of the inverter means becomes the low level, the OR circuit turns on the second P-channel MOS transistor, with the result that the output line is brought to the high level. Accordingly, if the input clock signal changes from the low level to the high level in a next cycle, the pulse generating circuit brings the output line to the low level, so that the normal pulse generating operation starts.

Therefore, even if the output is at the high level in the initial condition, the pulse generating circuit starts the normal pulse generating operation after a dummy operation of one cycle. Accordingly, a dedicated circuit such as the power-on circuit for stabilizing the pulse generation, is no longer necessary.

The invention has thus been shown and described with reference to the specific embodiments. However, it should be noted that the present invention is in no way limited to the details of the illustrated structures but changes and modifications may be made within the scope of the appended claims.

What is claimed is:

1. A pulse generating circuit comprising a first pulse generating means receiving an input clock signal for generating a first pulse in synchronism with the clock signal, a first P-channel MOS transistor having a source connected to a high voltage supply, a gate connected to an output of the first pulse generating means and a drain connected to an output line, a first delay means having a first predetermined delay time and having an input connected to the output line, a second pulse generating means having an input connected to an output of the first delay means, for generating a second pulse in synchronism with a level transition of the output of the first delay means, a first N-channel MOS transistor having a drain connected to the output line, a gate connected to an output of the second pulse generating means and a source connected to ground, and a detecting means connected to the output of the first pulse generating means and also connected to the output line, for bringing the output line to a low level when the input clock signal changes from a low level to a high level in the condition that the output line is at a high level.

2. A clock generating circuit claimed in claim 1 wherein the detecting means includes a second delay means having a second predetermined delay time and having an input connected to the output line, an inverter means having an input connected to the output of the first pulse generating means, an AND circuit receiving an output of the inverter means and an output of the second delay means, and a second N-channel MOS transistor having a drain connected to the output line, a gate connected to an output of the AND circuit and a source connected to the ground.

3. A clock generating circuit claimed in claim 2 wherein the second predetermined delay time of the second delay means is longer than a pulse width of the first pulse generated by the first pulse generating means.

4. A clock generating circuit claimed in claim 3 wherein the first pulse generating means generates a downward pulse, and the second pulse generating means generates an upward pulse.

5. A clock generating circuit claimed in claim 2 wherein the first pulse generating means generates a downward pulse, and the second pulse generating means generates an upward pulse.

6. A pulse generating circuit comprising a first pulse generating means receiving an input clock signal for generating a first pulse in synchronism with the clock signal, a first N-channel MOS transistor having a drain connected to an output line, a gate connected to an output of the first pulse generating means and a source connected to ground, a first delay means having a first predetermined delay time and having an input connected to the output line, a second pulse generating means having an input connected to an output of the first delay means, for generating a second pulse in synchronism with a level transition of the output of the first delay means, a first P-channel MOS transistor having a source connected to a high voltage supply, a gate connected to an output of the second pulse generating means and a drain connected to the output line, and a detecting means connected to the output of the first pulse generating means and also connected to the output line, for bringing the output line to a high level when the input clock signal changes from a low level to a high level in the condition that the output line is at a low level.

7. A clock generating circuit claimed in claim 6 wherein the detecting means includes a second delay means having a second predetermined delay time and having an input connected to the output line, an inverter means having an input connected to the output of the first pulse generating means, an OR circuit receiving an output of the inverter means and an output of the second delay means, and a second P-channel MOS transistor having a source connected to the high voltage supply, a gate connected to an output of the OR circuit and a drain connected to the output line.

8. A clock generating circuit claimed in claim 7 wherein the second predetermined delay time of the second delay means is longer than a pulse width of the first pulse generated by the first pulse generating means.

9. A clock generating circuit claimed in claim 8 wherein the first pulse generating means generates an upward pulse, and the second pulse generating means generates a downward pulse.

10. A clock generating circuit claimed in claim 7 wherein the first pulse generating means generates an upward pulse, and the second pulse generating means generates a downward pulse.

* * * * *